(12) United States Patent
Maehara

(10) Patent No.: US 7,593,232 B2
(45) Date of Patent: Sep. 22, 2009

(54) ELECTRONIC APPARATUS AND CIRCUIT BOARD UNIT

(75) Inventor: Daisuke Maehara, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 210 days.

(21) Appl. No.: 11/543,127

(22) Filed: Oct. 5, 2006

(65) Prior Publication Data

US 2007/0091577 A1    Apr. 26, 2007

(30) Foreign Application Priority Data

Oct. 21, 2005    (JP)    ............................. 2005-307009

(51) Int. Cl.
*H05K 7/20* (2006.01)
*F28F 7/00* (2006.01)
*H01L 23/34* (2006.01)

(52) U.S. Cl. .................. 361/721; 361/679.52; 361/700; 361/719; 361/752; 165/80.4; 165/104.33; 165/185; 257/714; 257/715; 174/15.2

(58) Field of Classification Search .................. 361/699, 361/700, 718–721; 165/80.4, 104.33; 257/714–715; 174/15.2
See application file for complete search history.

(56) References Cited

U.S. PATENT DOCUMENTS

| 5,268,812 A | * | 12/1993 | Conte ........................ 361/698 |
| 5,969,945 A | * | 10/1999 | Cutting et al. .............. 361/704 |
| 6,008,987 A | * | 12/1999 | Gale et al. ................... 361/700 |
| 7,327,571 B2 | * | 2/2008 | Giardina et al. ............. 361/700 |
| 2005/0024831 A1 | * | 2/2005 | Phillips et al. .............. 361/700 |
| 2007/0268670 A1 | * | 11/2007 | Chu et al. ................... 361/702 |
| 2008/0156519 A1 | * | 7/2008 | Lin et al. ..................... 174/252 |

FOREIGN PATENT DOCUMENTS

| JP | 11-087967 | 3/1999 |
| JP | 2000-138485 | 5/2000 |
| JP | 2002-016388 | 1/2002 |
| JP | 2004-006603 | 1/2004 |

* cited by examiner

*Primary Examiner*—Jayprakash N Gandhi
*Assistant Examiner*—Zachary M Pape
(74) *Attorney, Agent, or Firm*—Pillsbury Winthrop Shaw Pittman, LLP

(57) ABSTRACT

An electronic apparatus is provided with a housing, a circuit board section and a heat transfer member. The circuit board section is accommodated in the housing. The circuit board section includes a heat generating component, a heat receiving region thermally connected to the heat generating component and a heat radiating region having a lower temperature than the heat receiving region while the apparatus is operating. The heat transfer member includes a first end portion attached in the heat receiving region and a second end portion attached in the heat radiating region.

13 Claims, 11 Drawing Sheets

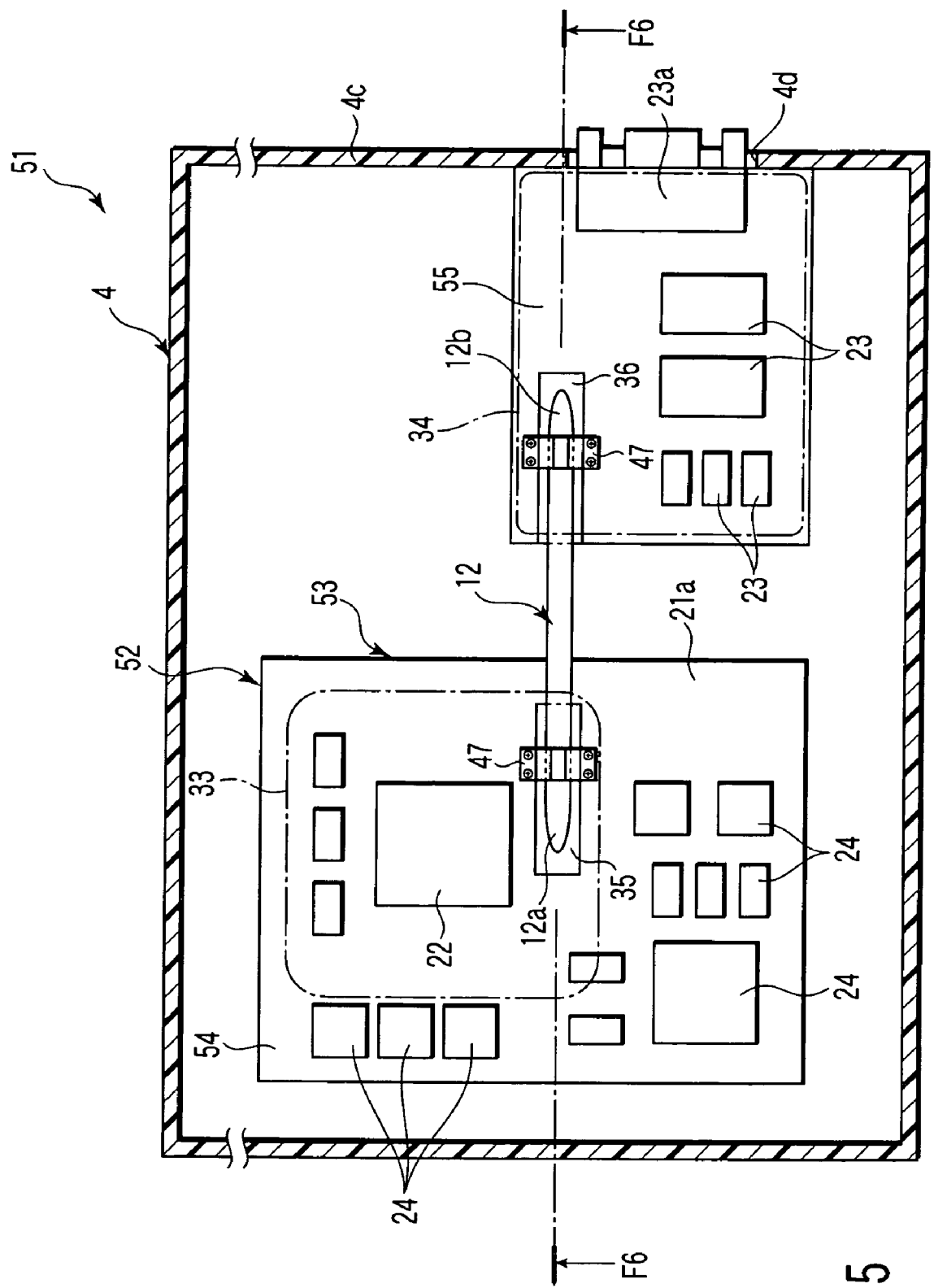
F I G. 5

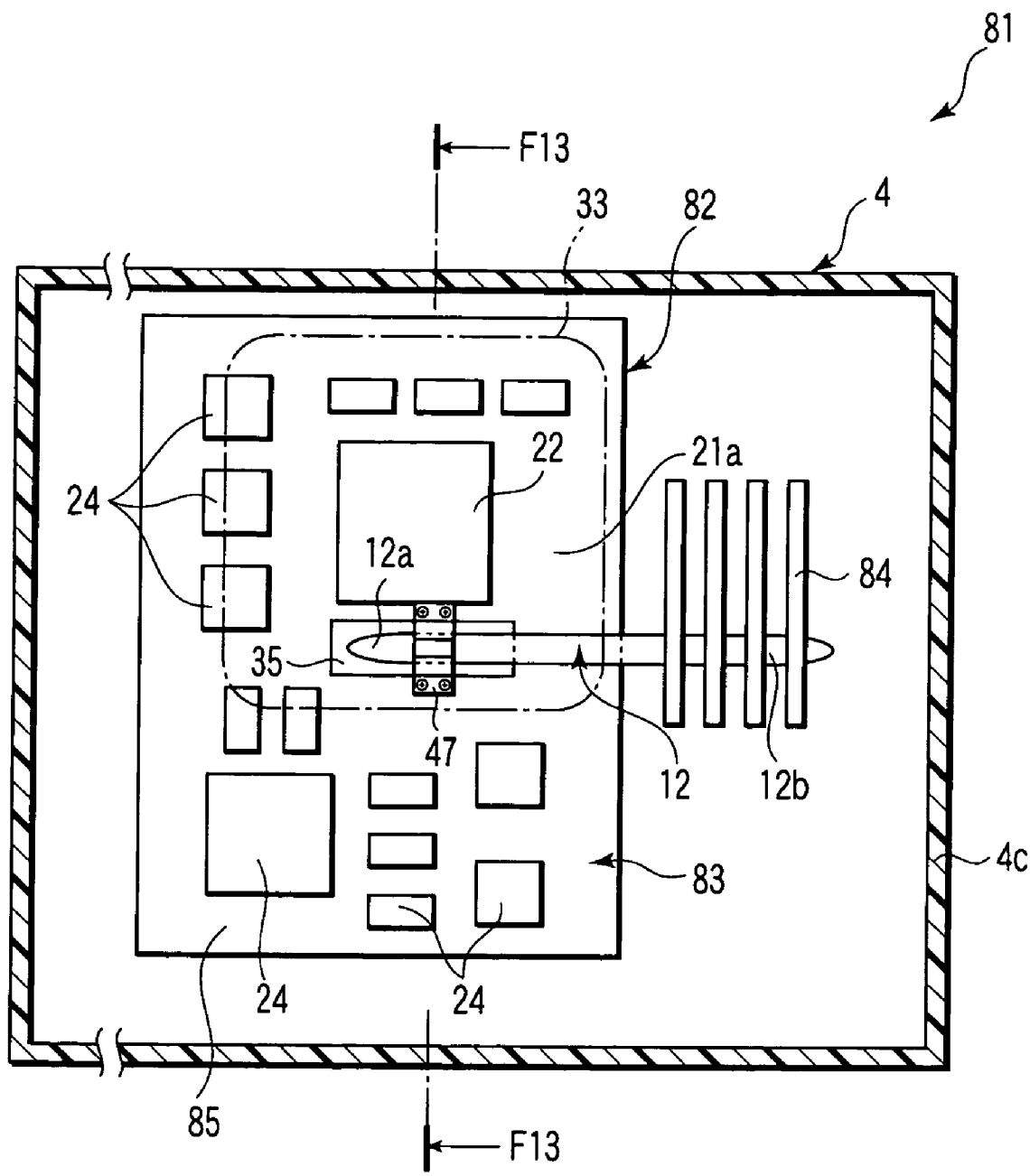
F I G. 12

ELECTRONIC APPARATUS AND CIRCUIT BOARD UNIT

CROSS-REFERENCE TO RELATED APPLICATIONS

This application is based upon and claims the benefit of priority from Japanese Patent Application No. 2005-307009, filed Oct. 21, 2005, the entire contents of which are incorporated herein by reference.

BACKGROUND

1. Field

One embodiment of the invention relates to a circuit board unit and an electronic apparatus, for example, a circuit board unit and electronic apparatus provided with a heat radiation structure which cools a circuit component.

2. Description of the Related Art

For example, a circuit board unit provided for an electronic apparatus such as a portable computer includes a circuit component such as a cpu. In recent years, semiconductor integration density has dramatically improved, and a calorific value of a circuit component is increasing. In a circuit component having a semiconductor mounted thereon, reliability and life duration are reduced if an operating temperature is very high. Thus, a circuit board unit includes a heat radiation structure which cools this circuit component.

As a heat radiation structure in the circuit board unit, one having a heat pipe and radiation fins combined with each other is well known. One end of the heat pipe is attached on an upper surface of a circuit component which is mounted on a printed circuit board and has a large calorific value. The other end of the heat pipe is extended to a position outside the printed circuit board and connected to the radiation fins. The heat pipe facilitates cooling of the circuit component by transferring heat generated from the circuit component to the radiation fins.

Further, as a heat radiation structure which cools a circuit component, a radiation device including a micro-heat pipe is disclosed in Jpn. Pat. Appln. KOKAI Publication No. 2002-16388. One end of this micro-heat pipe is arranged in contact with a heat generator on a printed board, and the other end of the same is thermally connected with a front panel attached at one end of the printed circuit board. In this radiation device, a portion of the front panel is utilized as a part of a heat sink.

As described above, the radiation structure of the circuit board unit is provided with a heat radiating member such as radiation fins or a radiation plate separately provided from the printed board, and the heat pipe which transfers heat from the circuit component to this radiation member.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIG. 5 is an exemplary sectional view of a portable computer according to a second embodiment of the invention;

FIG. 12 is an exemplary sectional view of a portable computer according to another embodiment.

DETAILED DESCRIPTION

Various embodiments according to the invention will be described hereinafter with reference to the accompanying drawings. In general, according to one embodiment of the invention, an electronic apparatus is provided with a housing, a circuit board section and a heat transfer member. The circuit board section is accommodated in the housing. The circuit board section includes a heat generating component, a heat receiving region thermally connected to the heat generating component and a heat radiating region having a lower temperature than the heat receiving region while the apparatus is operating. The heat transfer member includes a first end portion attached in the heat receiving region and a second end portion attached in the heat radiating region.

Embodiments according to the present invention will now be described hereinafter with reference to the accompanying drawings applied to a portable computer.

Figure 1:
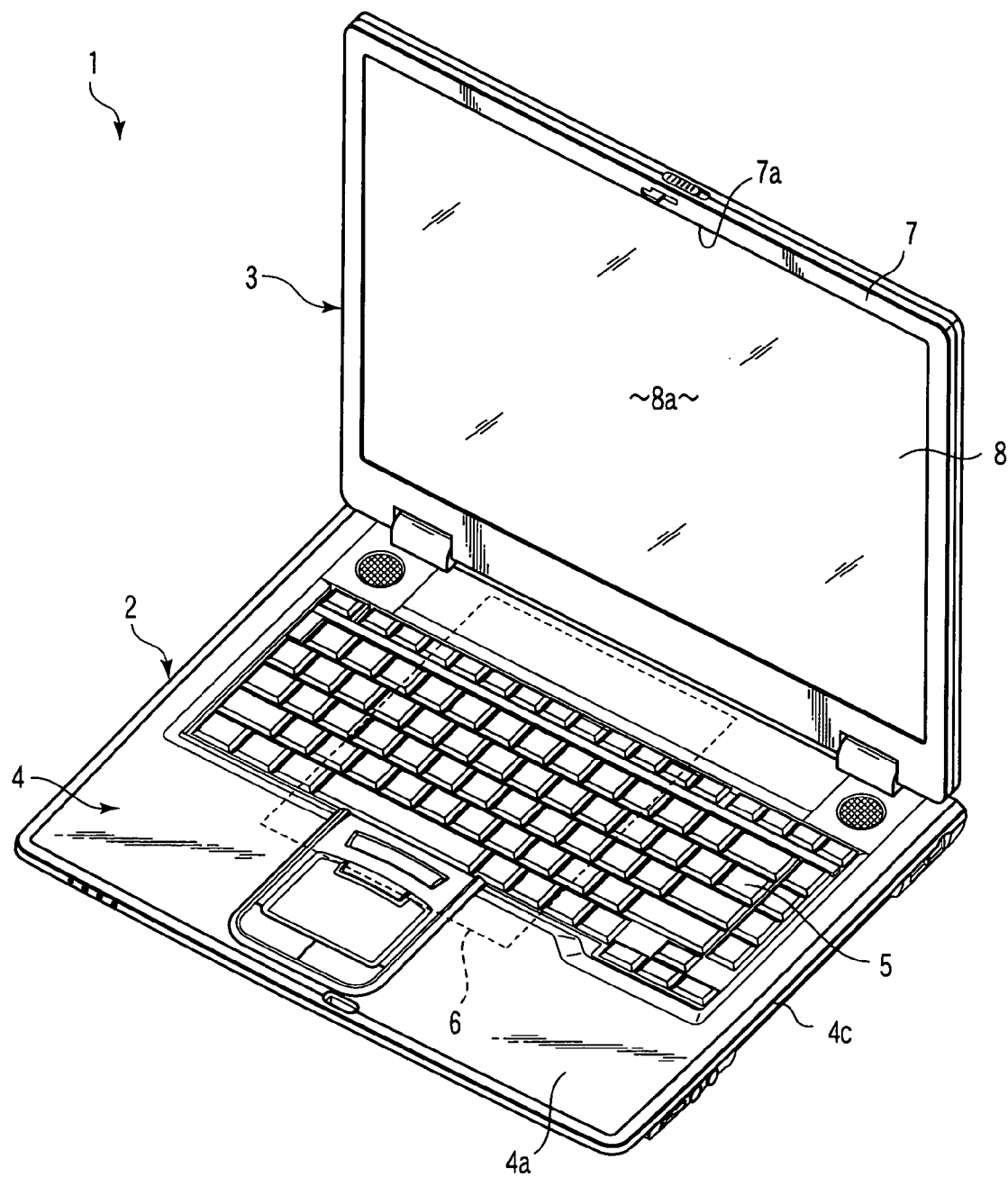
FIG. 1 is an exemplary perspective view of a portable computer according to a first embodiment of the invention.

FIGS. 1 to 4 show a portable computer 1 as an electronic apparatus according to a first embodiment of the present invention. As shown in FIG. 1, the portable computer 1 is provided with a main body 2 and a display unit 3.

The main body 2 includes a housing 4. The housing 4 is formed into a rectangular box-like shape having an upper wall 4a, a bottom wall 4b and a side wall 4c. The upper wall 4a of the case 4 supports a keyboard 5. The housing 4 accommodates a circuit board unit 6 therein.

The display unit 3 is provided with a display housing 7 and a liquid crystal display module 8 accommodated in this display housing 7. The liquid crystal display module 8 has a display screen 8a. This display screen 8a is exposed to the outside of the display housing 7 through an opening portion 7a on a front surface of the display housing 7.

The display housing 7 is supported at a rear end portion of the housing 4 by means of a hinge device. Therefore, the display housing 7 can swivel between a closed position in which it is taken down to cover the upper wall 4a and an open position in which it stands up to expose the upper wall 4a.

Figure 2:
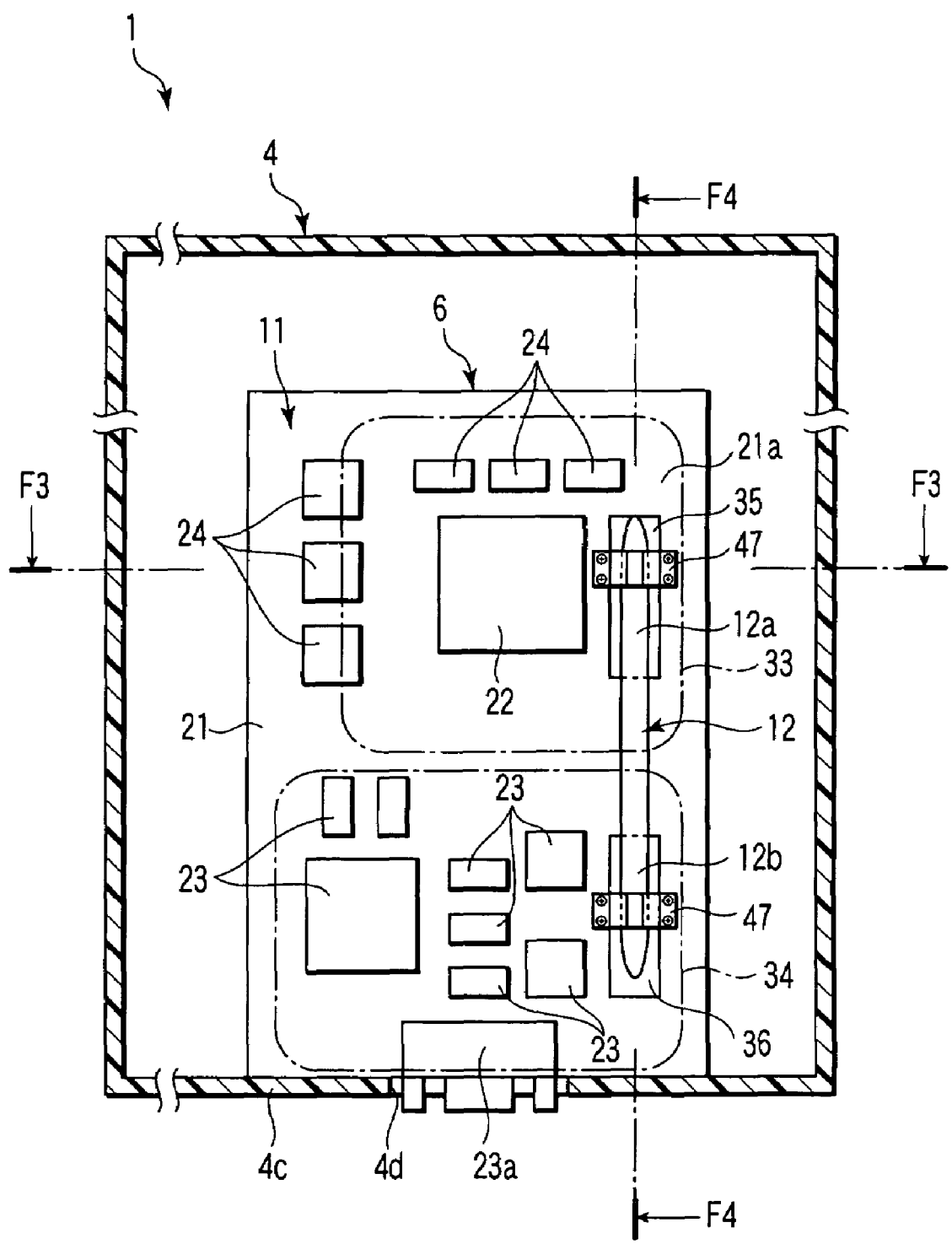
FIG. 2 is an exemplary sectional view of the portable computer according to the first embodiment.

As shown in FIG. 2, the circuit board unit 6 mounted in the main body 2 is provided with a circuit board section 11 and a heat pipe 12. The circuit board section 11 has a printed circuit board 21 and a central processing unit 22 (which will be referred to as a CPU 22 hereinafter), circuit components 23 and circuit components 24 which are mounted on the printed circuit board 21.

Figure 3:
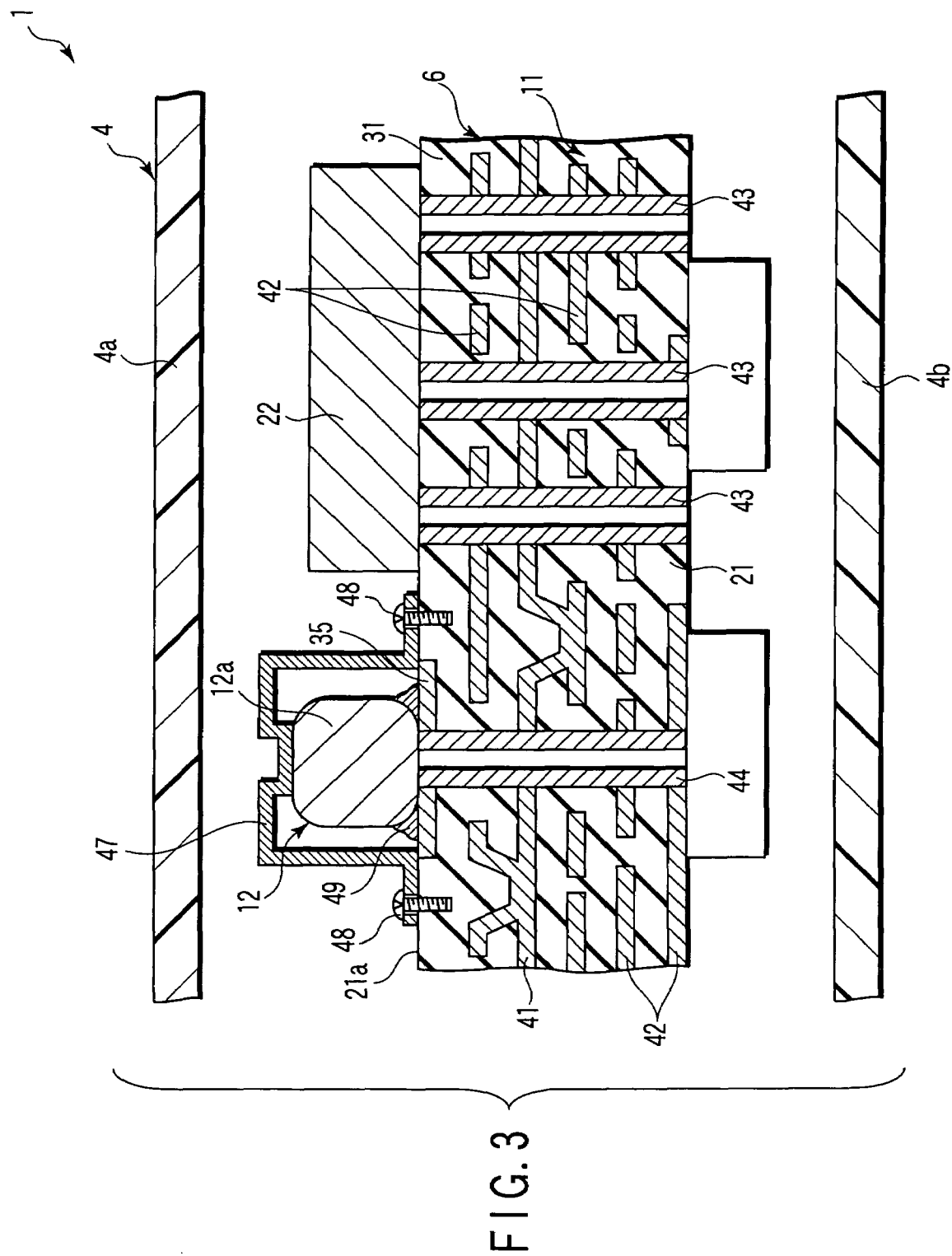
FIG. 3 is an exemplary sectional view of the portable computer taken along a line F3-F3 depicted in FIG. 2.

As shown in FIG. 3, one example of the printed circuit board 21 is a multilayer printed circuit board, and has a board main body 31 as an insulator and a plurality of conductor layers superimposed in the board main body 31. The printed circuit board 21 has a mount surface 21a on which various kinds of circuit components are mounted.

As shown in FIG. 2, the CPU 22 is mounted on one end portion of the mount surface 21a, for example. The CPU 22 is an example of a circuit component which generates a large calorific value (which will be referred to as a heat generating component hereinafter). It is to be noted that the heat generating component is not restricted to the CPU 22, and it corresponds to a circuit component which generates a larger calorific value than other circuit components mounted in the circuit board section 11. As examples of the heat generating component other than the CPU 22, there are a north bridge, a memory, a graphic chip, a graphic controller, a power supply circuit and others.

As shown in FIG. 2, the circuit components 23 are mounted on the other end portion of the mount surface 21a. Each of the circuit components is a component which generates a smaller calorific value than the CPU 22. Types of the circuit components 23 are not restricted as long as their calorific values are smaller than those of the above-described heat generating components. The circuit components 23 having particularly small calorific values such as various kinds of connectors or ports are collectively mounted on the other end portion of the mount surface 21a according to this embodiment.

For example, a connector having a large capacity such as an I/O connector 23a which is to be connected with a peripheral device is mounted as one of the circuit components 23. The I/O connector 23a is in contact with the side wall 4c of the case 4, and exposed to the outside of the case 4 through an opening portion 4d which opens on the side wall 4c.

The printed circuit board 21 includes a heat receiving region 33 and a heat radiating region 34 on the mount surface 21a. As shown in FIG. 2, the heat receiving region 33 is formed at the periphery of the CPU 22 to surround the CPU 22. The heat receiving region 33 is a region where heat from the CPU 22 flows in to increase a temperature in the printed circuit board 21 when the CPU 22 generates heat. That is, the heat receiving region 33 is thermally connected to the CPU 22.

On the other hand, the heat radiating region 34 is formed at a position outside the CPU 22 in the printed circuit board 21. The heat radiating region 34 is not affected so much by heat from the CPU 22 even through the CPU 22 generates heat, and it is a region where a temperature is lower than that in the heat receiving region 33 while the portable computer 1 is operating. The circuit components 23 are mounted in the heat radiating region 34 according to this embodiment. It is to be noted that the heat radiating region 34 does not have to have mounted the circuit components 23 therein, and its position and structure are not restricted as long as the heat radiating region 34 is a region where a temperature is lower than that in the heat receiving region 33.

As shown in FIG. 2, the printed circuit board 21 further has a first conductor layer 35 and a second conductor layer 36. The first conductor layer 35 is provided in the heat receiving region 33 and placed in the vicinity of the CPU 22. The first conductor layer 35 is exposed to the outside of the circuit board section 11. An example of a material of the first and second conductor layers 35 and 36 is a copper foil. An example of a material of the first and second conductor layers 35 and 36 is not restricted as long as it is a material having higher thermal conductivity than the board main body 31, e.g., a metal material such as gold, silver, platinum or aluminum. A type of the metal material is not restricted.

As shown in FIG. 3, the printed circuit board 21 has a ground layer 41, a plurality of other third conductor layers 42 and first and second through holes 43 and 44 in the board main body 31. The ground layer 41 is largely formed to extend on a substantially entire surface of the printed circuit board 21. It is to be noted that the ground layer 41 is also one of the conductor layers. The third conductor layers 42 constitute a part of an electrical circuit of the printed circuit board 21. A material of the ground layers 41 and the third conductor layers 42 may be or may not be the same as the material of the first and second conductor layers 35 and 36. Each of the first and second through holes 43 and 44 is, e.g., a plated through hole, and it is an example of a via hole.

As shown in FIG. 3, the first through hole 43 downwardly extends from a lower surface of the CPU 22 to pierce the board main body 31. The first through hole 43 electrically connects the CPU 22 to the third conductor layers 42 or earths the CPU 22 to the ground layer 41. Furthermore, the first through hole 43 thermally connects the CPU 22 with the ground layer 41 and the third conductor layers 42.

The second through hole 44 downwardly extends from the first conductor layer 35 to pierce the board main body 31. The second through hole 44 thermally connects the first conductor layer 35 with the ground layer 41 and the third conductor layers 42. That is, the first conductor layer 35 is thermally connected to the CPU 22 through the ground layer 41 and the third conductor layers 42.

Figure 4:
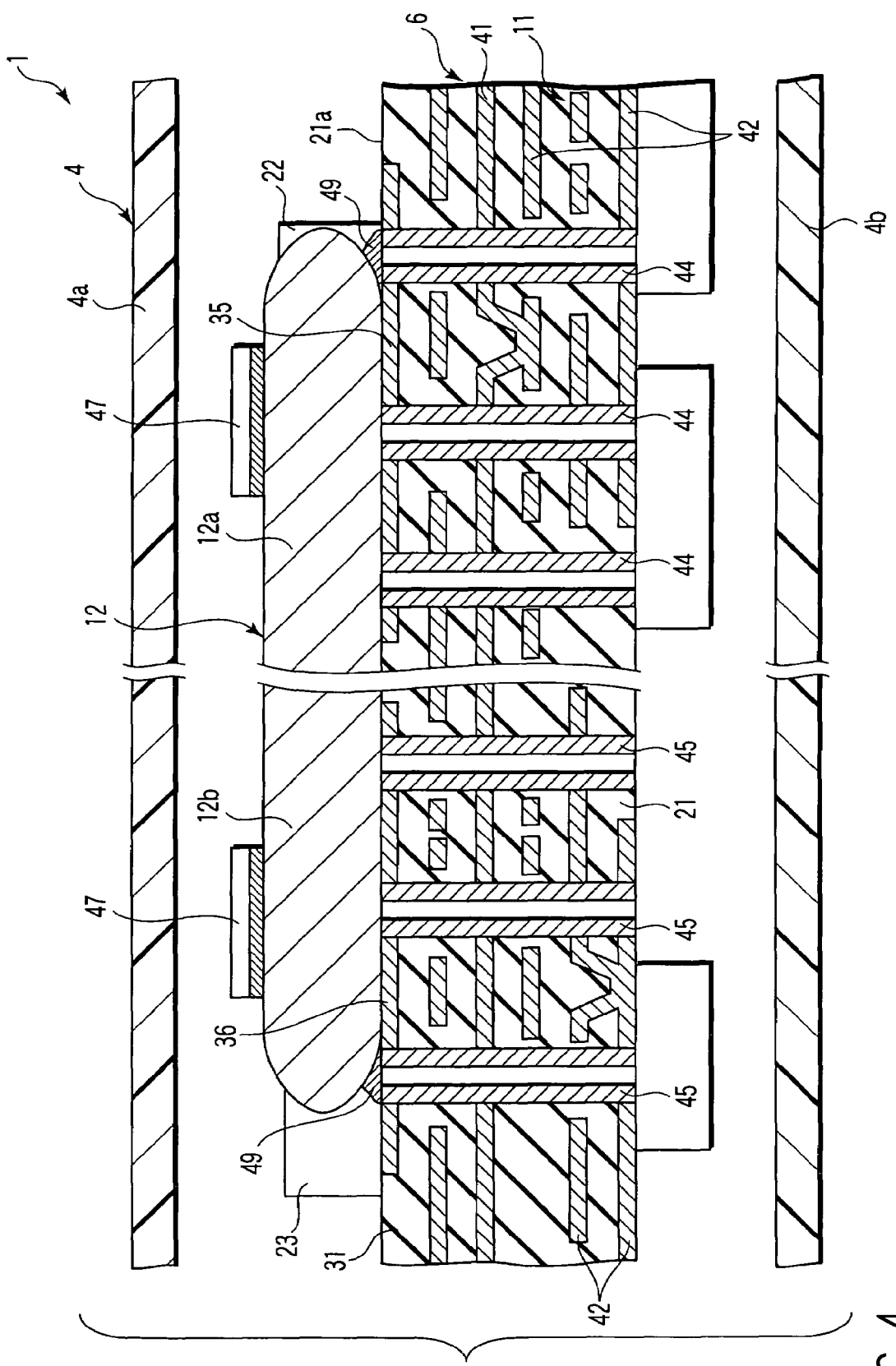
FIG. 4 is an exemplary sectional view of the portable computer taken along a line F4-F4 depicted in FIG. 2.

As shown in FIG. 2, the second conductor layer 36 is provided in the heat radiating region 34. The second conductor layer 36 is exposed to the outside of the circuit board section 11. As shown in FIG. 4, the printed circuit board 21 further has a third through hole 45. The third through hole 45 is, e.g., a plated through hole, and it is an example of a via hole. The third through hole 45 downwardly extends from the second conductor layer 36 to pierce the board main body 31. The third through hole 45 thermally connects the second conductor layer 36 with the ground layer 41 and the third conductor layers 42.

It is to be noted that the via hole is not restricted to the first to third through holes 43, 44 and 45 and it may be, e.g., an internal via hole (IVH) or a connection hole in which an electroconductive paste is filled.

The heat pipe 12 is an example of a heat transfer member. As shown in FIG. 2, the heat pipe 12 is arranged in the printed circuit board 21. The heat pipe 12 has a first end portion 12a and a second end portion 12b. The heat pipe 12 has a working fluid filled therein and transfers heat between the first end portion 12a and the second end portion 12b.

The first end portion 12a of the heat pipe 12 is attached to the first conductor layer 35 of the printed circuit board 21. The first end portion 12a is in contact with the first conductor layer 35 and thermally connected to the first conductor layer 35. The second end portion 12b is attached to the second conductor layer 36 of the printed circuit board 21. The second end portion 12b is in contact with the second conductor layer 36 and thermally connected to the second conductor layer 36. The first and second end portions 12a and 12b are attached on the same surface as the mount surface 21a on which the CPU 22 is mounted, and arranged to be aligned with the CPU 22 in a horizontal direction.

As shown in FIGS. 3 and 4, the first and second end portions 12a and 12b of the heat pipe 12 are fixed to the printed board 21 by using fixing brackets 47. That is, the fixing brackets 47 are fixed on the printed circuit board 21 by screws 48 in a state where the first and second end portions 12*a* and 12*b* are sandwiched between the fixing brackets 47 and the printed circuit board 21.

It is to be noted that the fixing method of the first and second end portions 12*a* and 12*b* is not restricted to a method using the fixing brackets 47. For example, the first and second end portions 12*a* and 12*b* may be pressed against the printed circuit board 21 by pressing means such as springs. Further, the first and second end portions 12*a* and 12*b* may be respectively soldered with respect to the first and second conductor layers 35 and 36. However, the heat pipe 12 itself has a very high temperature, and hence a joining method with high heat resisting properties such as fixing brackets 47 or springs is appropriate as the fixing method.

It is to be noted that a heat transfer material 49 like a grease is interposed between the first and second end portions 12*a* and 12*b* and the first and second conductor layers 35 and 36 in this embodiment as shown in FIGS. 3 and 4. As a result, thermal conductivity between the first and second end portions 12*a* and 12*b* and the first and second conductor layers 35 and 36 can be increased.

It is to be noted a structure of the heat pipe 12 and a type of the working fluid are no object in particular. Furthermore, the heat transfer member is not restricted to the heat pipe 12, and its type is no object as long as the heat transfer member is a member which can effectively transfer heat as compared with the board main body 31. The heat transfer member may be a plate material or a rod material formed of a metal, e.g., copper or aluminum.

A function of the portable computer 1 will now be described.

When the portable computer 1 is used, the CPU 22 mounted on the printed board 21 generates heat. A part of the heat generated from the CPU 22 is transferred to the first conductor layer 35 via the first through hole 43, the ground layer 41, the third conductor layers 42 and the second through hole 44 thermally connected with each other. Moreover, a part of the heat generated from the CPU 22 is directly transferred to the first conductor layer 35 through the board main body 31. The heat transferred to the first conductor layer 35 is further transferred to the first end portion 12*a* of the heat pipe 12 connected with the first conductor layer 35.

The heat radiating region 34 of the printed circuit board 21 in which the second end portion 12*b* of the heat pipe 12 is attached has a temperature lower than that in the heat receiving region 33 in which the first end portion 12*a* is attached. Therefore, the heat pipe 12 transfers heat of the first end portion 12*a* to the second end portion 12*b*.

Heat transferred to the second end portion 12*b* of the heat pipe 12 further transfers to the second conductor layer 36. A part of the heat transferred to the second conductor layer 36 is diffused in the heat radiating region 34 through the third through hole 45, the ground layer 41 and the third conductor layers 42. Additionally, a part of the heat transferred to the second conductor layer 36 is diffused in the heat radiating region 34 through the board main body 31. The printed circuit board 21 itself functions as a heat radiating member, and a part of the heat diffused in the heat radiating region 34 is discharged to the outside of the circuit board unit 6.

Additionally, a part of the heat which has transferred to the heat radiating region 34 further transfers to the housing 4 through the I/O connector 23*a*. The housing 4 functions as a heat radiating member, and the heat which has transferred to the housing 4 is discharged to the outside of the housing 4.

As described above, the circuit board unit 6 discharges heat generated from the CPU 22 to the outside of the circuit board unit 6 to facilitate cooling the CPU 22.

According to the portable computer 1 including such a configuration, the radiation structure can be reduced in size. That is, when the heat pipe 12 is provided to extend from the region 33 having a high temperature to the region 34 having a low temperature in the printed circuit board 21, transfer of heat in the printed circuit board 21 can be facilitated.

That is, when heat generated by the CPU 22 is transferred to the region 34 having a low temperature in the printed circuit board 21, the heat can be efficiently diffused in the printed circuit board 21. As a result, it is possible to suppress a local increase in temperature in the printed circuit board 21. Therefore, a size of each heat radiating member required to cool the printed circuit board 21 and the CPU 22 can be reduced.

Further, when heat is diffused in the entire printed circuit board 21, the entire structure of the printed circuit board 21 can function as the heat radiating member. As a result, the heat generating members can be cooled down. That is, according to the circuit board unit 6 of the present invention, the printed circuit board 21 itself effectively functions as the heat radiating member.

Therefore, the heat radiating member such as radiation fins or a radiation plate which has been conventionally required separately from the printed circuit board 21 can be eliminated or reduced in size. Accordingly, the radiation structure of the printed circuit unit 6 can be reduced for an amount corresponding to a space required by the radiation fins or the radiation plate.

As a result, the radiation structure can be reduced in size. Furthermore, a reduction in size and thickness of the circuit board unit 6 and the portable computer 1 can be achieved. Achieving a reduction in size of the radiation structure means that the degree of freedom in design of the circuit board unit 6 and the portable computer 1 can be improved.

As the heat transfer member, the heat pipe 12 is appropriate because it can transfer a large amount of heat as compared with other heat transfer members.

When the heat receiving region 33 and the heat radiating region 34 are formed in one printed circuit board 21, cooling of the heat generating components mounted on the printed circuit board can be facilitated even in the circuit board unit 6 and the portable computer 1 having one printed circuit board alone.

When the circuit components are also mounted in the heat radiating region 34, the printed circuit board 21 itself can be reduced in size. This contributes to a reduction in size and thickness of the circuit board unit 6 and the portable computer 1. If circuit component 23 is a component having a large capacity like the I/O connector 23*a*, a large space can be assured for the heat radiating region 34. Moreover, a large heat capacity of the circuit board section 11 can be assured. As a result, this can increase the radiation effect of the circuit board section 11 and contribute to stability of uniformization of temperature of the circuit board section 11.

When the circuit component 23 mounted in the heat radiating region 34 is in contact with the housing 4, a part of the housing 4 as well as the printed circuit board 21 can function as the heat radiating member. As a result, the heat generating components can be more effectively cooled.

For example, when the circuit component 23 having a particularly small calorific value is intensively mounted at a predetermined position to intentionally form the heat radiating region 34 having a large temperature difference from the heat receiving region 33, diffusion of heat in the printed circuit board 21 can be further facilitated. In general, a portion in the vicinity of the side wall 4*c* has a lower temperature than the central portion in the case 4. Therefore, it is further appropriate to form the heat radiating region 34 closer to the side wall 4c as compared with the heat receiving region 33.

Figure 8:
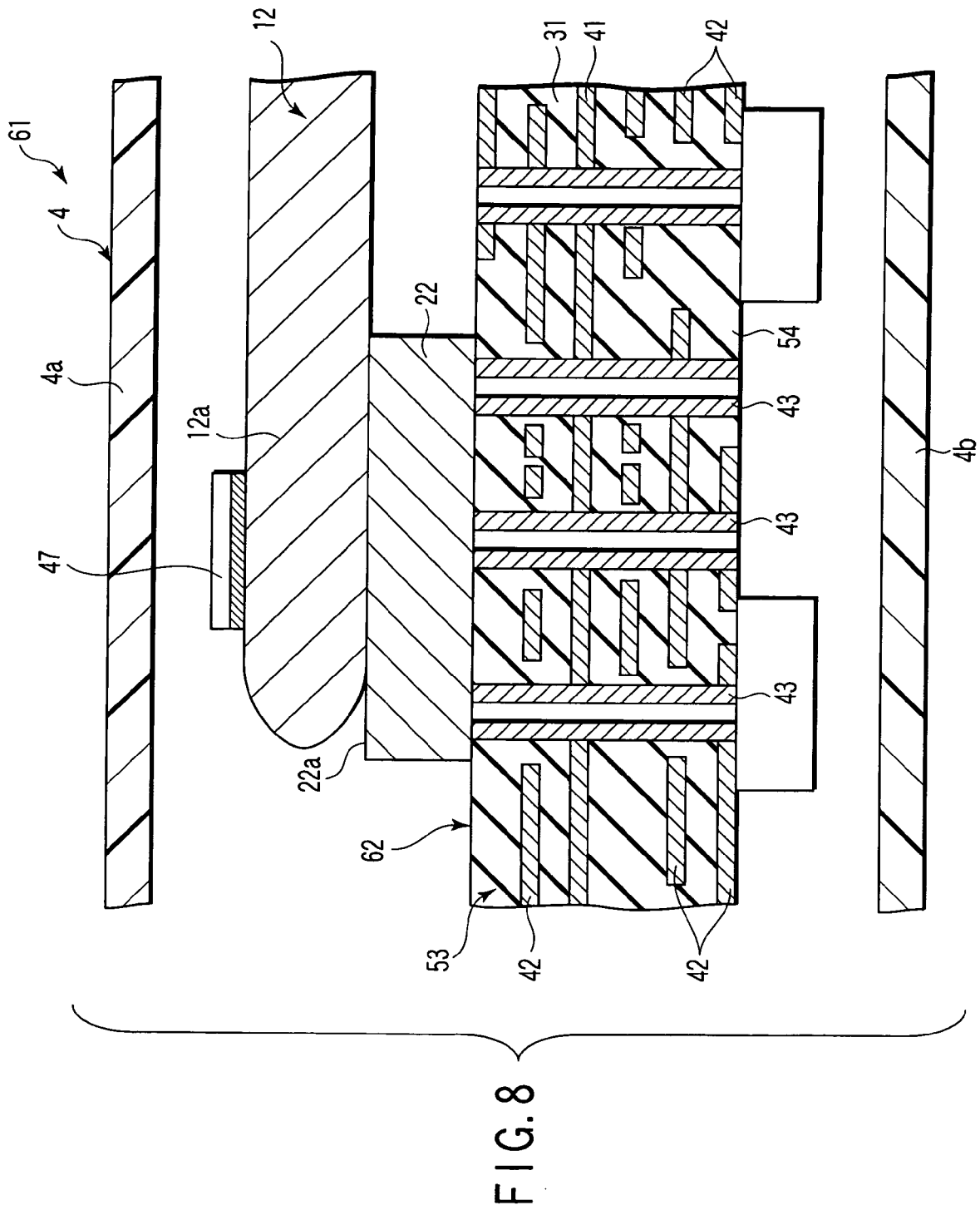
FIG. 8 is an exemplary sectional view of the portable computer taken along a line F8-F8 depicted in FIG. 7.

When the first end portion 12a of the heat pipe 12 is directly attached to the upper surface of the CPU 22, the circuit board unit 6 has a thickness obtained by adding thicknesses of the printed circuit board 21, the CPU 22 and the heat pipe 12 (see FIG. 8). However, when the heat pipe 12 is attached to the mount surface 21a on which the CPU 22 is mounted, the thickness of the circuit board unit 6 can be reduced to a larger one of a value obtained by adding thicknesses of the printed circuit board 21 and the heat pipe 12 and a value obtained by adding thicknesses of the printed circuit board 21 and the CPU 22. As a result, the circuit board unit 6 and the portable computer 1 can be reduced in thickness.

Although the heat pipe 12 is not directly attached to the CPU 22, it is positioned in the vicinity of the CPU 22. Therefore, the first end portion 12a of the heat pipe 12 can sufficiently absorb the heat generated from the CPU 22.

When the printed circuit board 21 has the first and second conductor layers 35 and 36, heat conductivity between the heat pipe 12 and the printed circuit board 21 can be increased. As a result, diffusion of heat in the printed circuit board 21 can be further facilitated.

When the printed circuit board 21 has the ground layer 41 and the third conductor layers 42, heat generated from the CPU 22 can be further effectively transferred to the first conductor layer 35. Furthermore, heat which has transferred to the second conductor layer 36 can be further effectively diffused in the printed circuit board 21. Utilizing the ground layer 41 having a particularly large area for transfer of heat can further facilitate transfer of heat in the printed circuit board 21. Moreover, since the ground layer 41 is not used to transmit a signal, a signal is not transmitted into the heat pipe 12. That is, the ground layer 41 is appropriate as a conductor layer connected with the heat pipe 12.

When the ground layer 41 and the third conductor layers 42 are thermally connected to the CPU 22 and the first and second conductor layers 35 and 36 through the first to third through holes 43, 44 and 45, transfer of heat is further facilitated.

A portable computer 51 as an electronic apparatus according to a second embodiment of the present invention will now be described with reference to FIGS. 5 and 6. It is to be noted that the same reference numerals denote structures having corresponding or similar functions as those of the portable computer 1 according to the first embodiment, thereby omitting their explanation.

As shown in FIG. 5, a circuit board unit 52 of the portable computer 51 is provided with a circuit board section 53 and a heat pipe 12. The circuit board section 53 has a first printed circuit board 54, a second printed circuit board 55, a CPU 22 and circuit components 23 and 24.

Each of the first and second printed circuit boards 54 and 55 is a multilayer printed circuit board, for example. As shown in FIG. 5, the CPU 22 is mounted and a heat receiving region 33 is formed on the first printed circuit board 54. The circuit components 23 are mounted and a heat radiating region 34 is formed on the second printed circuit board 55.

Figure 6:
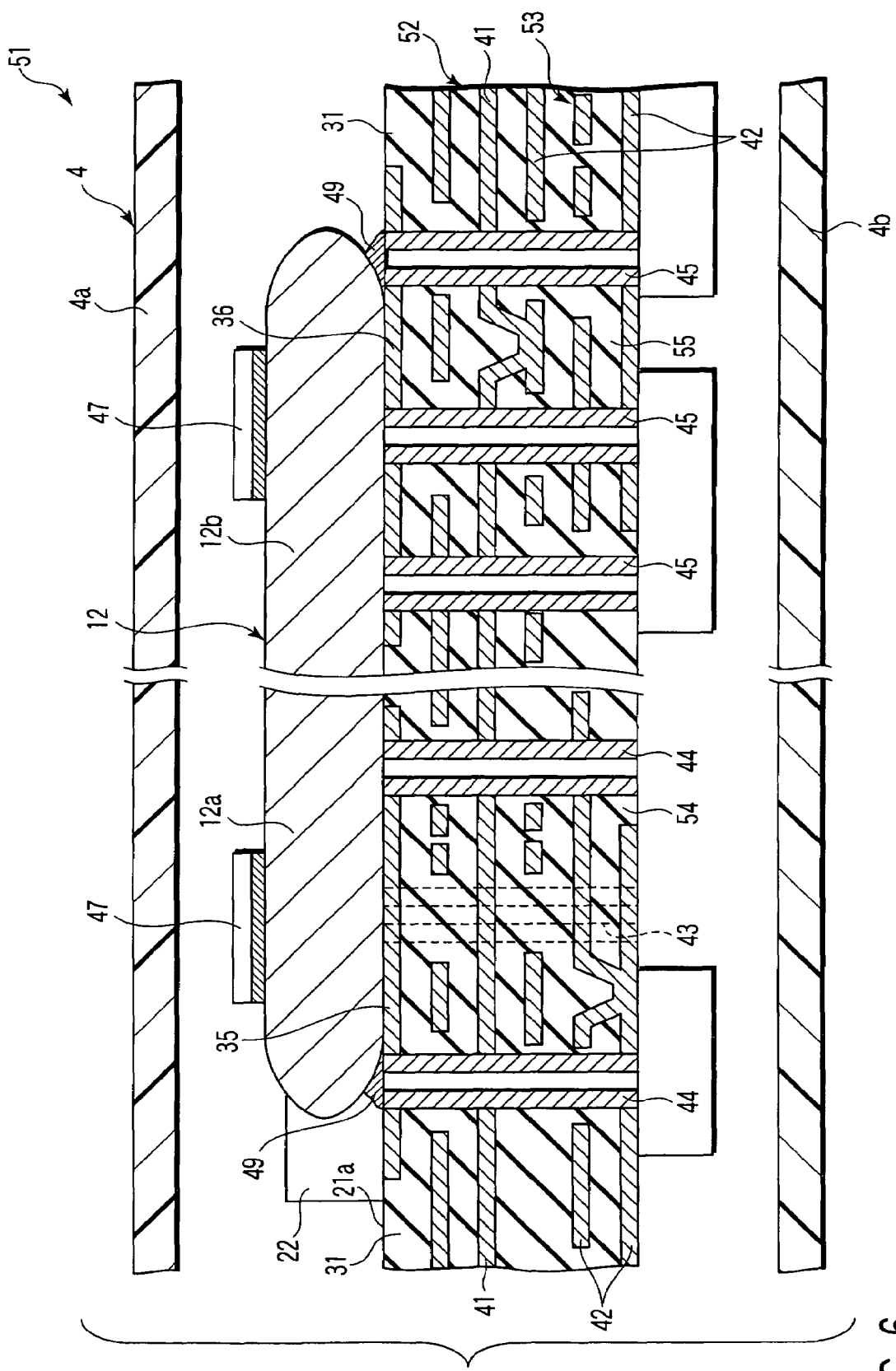
FIG. 6 is an exemplary sectional view of the portable computer taken along a line F6-F6 depicted in FIG. 5.

As shown in FIG. 6, the first printed circuit board 54 has a ground layer 41, third conductor layers 42, and first and second through holes 43 and 44. The second printed circuit board 55 has the ground layer 41, the third conductor layers 42 and a third through hole 45.

As shown in FIG. 5, the heat pipe 12 is arranged to extend from the first printed circuit board 54 to the second printed circuit board 55.

According to the portable computer 51 having such a configuration, a reduction in size of a radiation structure can be achieved. That is, when the heat pipe 12 is provided to extend from the first printed circuit board 54 on which the CPU 22 is mounted to the second printed circuit board 55 having a lower temperature than that of the first printed circuit board 54, heat can be diffused in the circuit board section 53.

That is, the heat generated by the CPU 22 is transferred to the second printed circuit board 55 having a low temperature. As a result, heat can be efficiently diffused in the circuit board section 53, and local heat generation in the circuit board section 53 can be suppressed. Therefore, it is possible to reduce a size of the heat radiating member required to cool the first printed circuit board 54 and the CPU 22.

Furthermore, when the second printed circuit board 55 is regarded as a heat radiating member and heat is transferred from the first printed circuit board 54 to the second printed circuit board 55, the second printed circuit board 55 functions as a heat radiating member. As a result, the heat generating components can be cooled. Therefore, like the circuit board unit 6 according to the first embodiment, radiation fins or radiation plate which has been conventionally required can be eliminated or reduced in size, thereby miniaturizing the radiation structure.

In particular, thermally connecting the second printed circuit board 55 with the first printed circuit board 54 allows the entire second printed circuit board 55 which conventionally does not contribute to heat radiation of the heat generating components to function as a heat radiating member. As a result, the heat generating components can be further cooled. This second printed circuit board 55 further effectively functions as the heat radiating member when the second printed circuit board 55 has the circuit components 23 each having a particularly small calorific value collectively mounted thereon and has a large temperature difference from the first printed circuit board 54.

A portable computer 61 as an electronic apparatus according to a third embodiment of the present invention will now be described with reference to FIGS. 7 and 8. It is to be noted that the same reference numerals denote structures having corresponding or similar functions as those of the portable computers 1 and 51 according to the first and second embodiments, thereby omitting their explanation.

Figure 7:
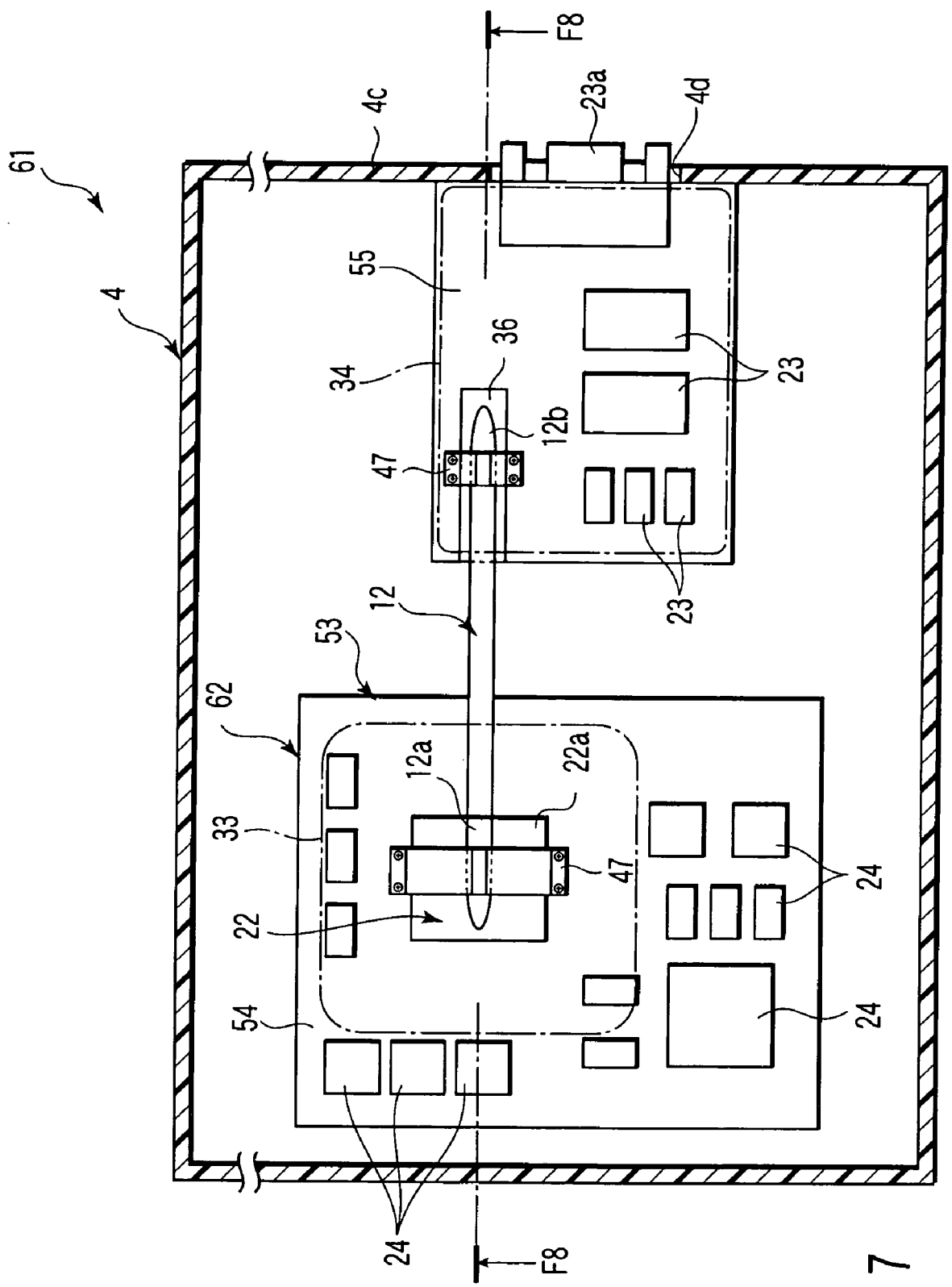
FIG. 7 is an exemplary sectional view of a portable computer according to a third embodiment of the invention.

As shown in FIG. 7, a circuit board unit 62 of the portable computer 61 has a circuit board section 53 and a heat pipe 12. As illustrated in FIGS. 7 and 8, a first end portion 12a of the heat pipe 12 is directly attached to an upper surface 22a of a CPU 22.

According to the portable computer 61 having such a configuration, a radiation structure can be reduced in size for the same reason as that of the portable computer 51 according to the second embodiment. As shown in FIG. 8, a thickness of the circuit board unit 62 according to this embodiment is large than that of the circuit board unit 6 according to the first embodiment. However, even in the circuit board unit 62 according to this embodiment, heat can be diffused in the circuit board unit 62, and a second printed circuit board 55 functions as a heat radiating member. As a result, the heat radiating member such as radiation fins or a radiation plate can be eliminated or reduced in size.

It is to be noted that the first end portion 12a of the heat pipe 12 may be directly attached to the CPU 22 in the circuit board unit provided in one printed circuit board 21 like the circuit board unit 6 according to the first embodiment.

Figure 10:
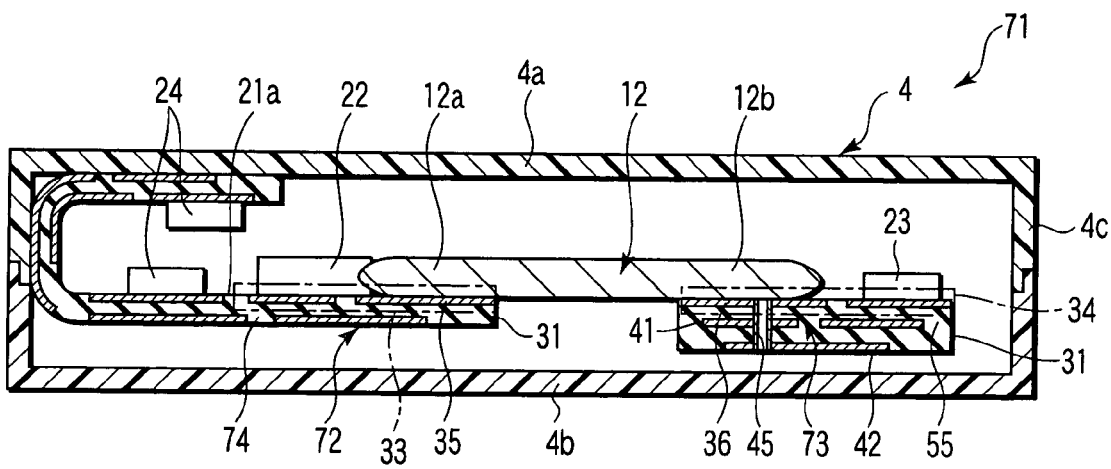
FIG. 10 is an exemplary sectional view of a modification of the portable computer according to the fourth embodiment.
Figure 11:
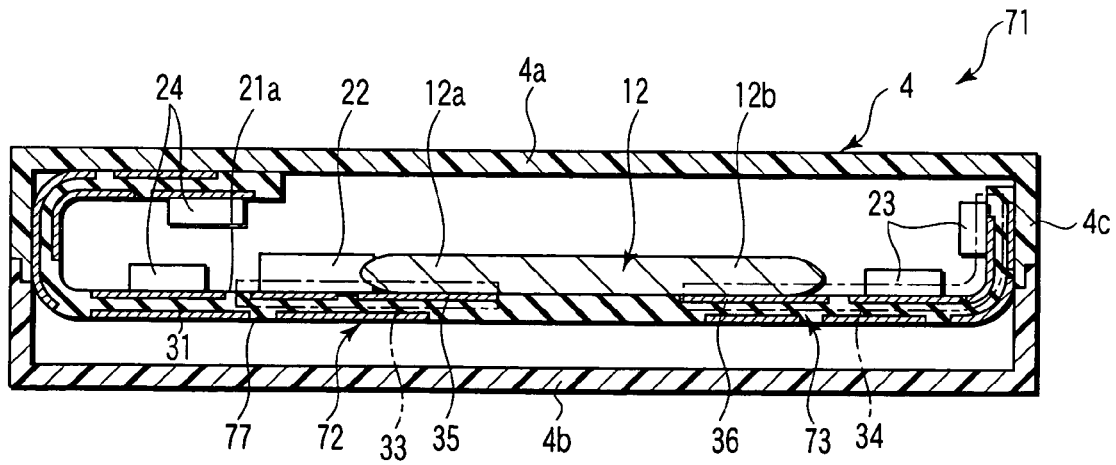
FIG. 11 is an exemplary sectional view of another modification of the portable computer according to the fourth embodiment.

A portable computer 71 as an electronic apparatus according to a fourth embodiment of the present invention will now be described with reference to FIGS. 9 to 11. It is to be noted that the same reference numerals denote structures having corresponding or similar functions as those of the portable computers 1 and 51 according to the first and second embodiments, thereby omitting their explanation.

Figure 9:
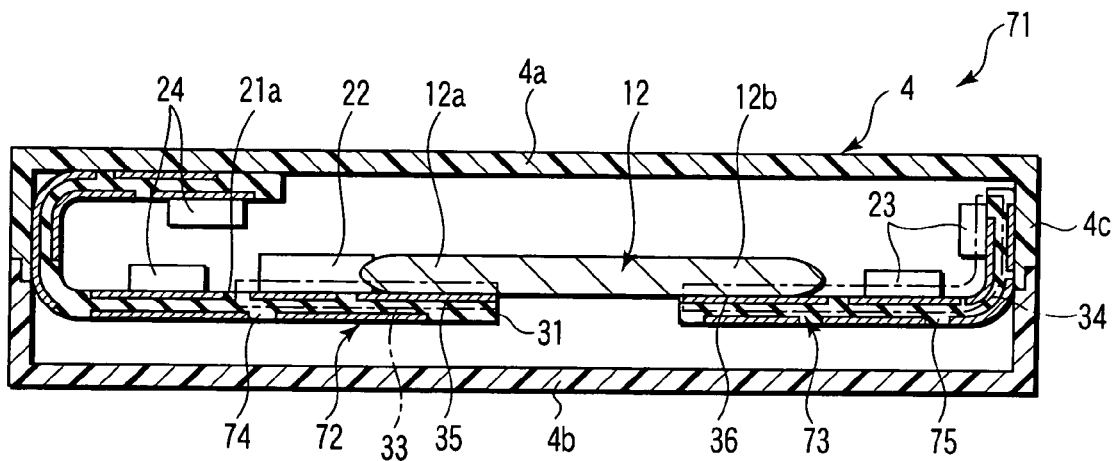
FIG. 9 is an exemplary sectional view of a portable computer according to a fourth embodiment of the invention.

As shown in FIG. 9, a circuit board unit 72 of the portable computer 71 has a circuit board section 73. Each of first and second printed circuit boards 74 and 75 of the circuit board section 73 is a flexible circuit board. A CPU 22 is mounted on the first printed circuit board 74. The first printed board 74 has a heat receiving region 33 formed therein. Circuit components 23 is mounted on the second printed circuit board. The second printed board 75 has a heat radiating region 34 formed therein.

According to the portable computer 71 having such a configuration, a radiation structure can be reduced in size for the same reason as that of the portable computer 51 according to the second embodiment.

When each of the first and second printed circuit boards 74 and 75 is a flexible circuit board, the first and second printed circuit boards 74 and 75 can be three-dimensionally arranged in a case 4. When the first and second printed circuit boards 74 and 75 can be three-dimensionally arranged, this can be contribute to a reduction in size and thickness of the circuit board unit 72 and the portable computer 71.

Since the flexible circuit board has a small number of conductor layers as compared with a rigid circuit board, heat is hard to be rapidly transferred in the flexible circuit board. Moreover, since the flexible circuit board generally has a small thickness and a small calorific value as compared with a rigid circuit board, cooling a heat generating component like the CPU 22 is not facilitated so much. Therefore, it is appropriate to use a heat pipe 12 in order to diffuse heat in the circuit board portion 73.

It is to be noted that both the first and second printed circuit boards 74 and 75 do not have to be the flexible circuit boards. For example, as shown in FIG. 10, the second printed circuit board may be a rigid circuit board 55 having a larger calorific value than the flexible circuit board. In this case, since a calorific value of the second printed circuit board 55 can be assured, this can contribute to facilitation of cooling the CPU 22. Additionally, the embodiments according to the present invention are not restricted to provision of the heat pipe 12 between the two flexible circuit board, and the heat pipe 12 may be attached in one flexible circuit board 77 as depicted in FIG. 11, for example.

Figure 13:
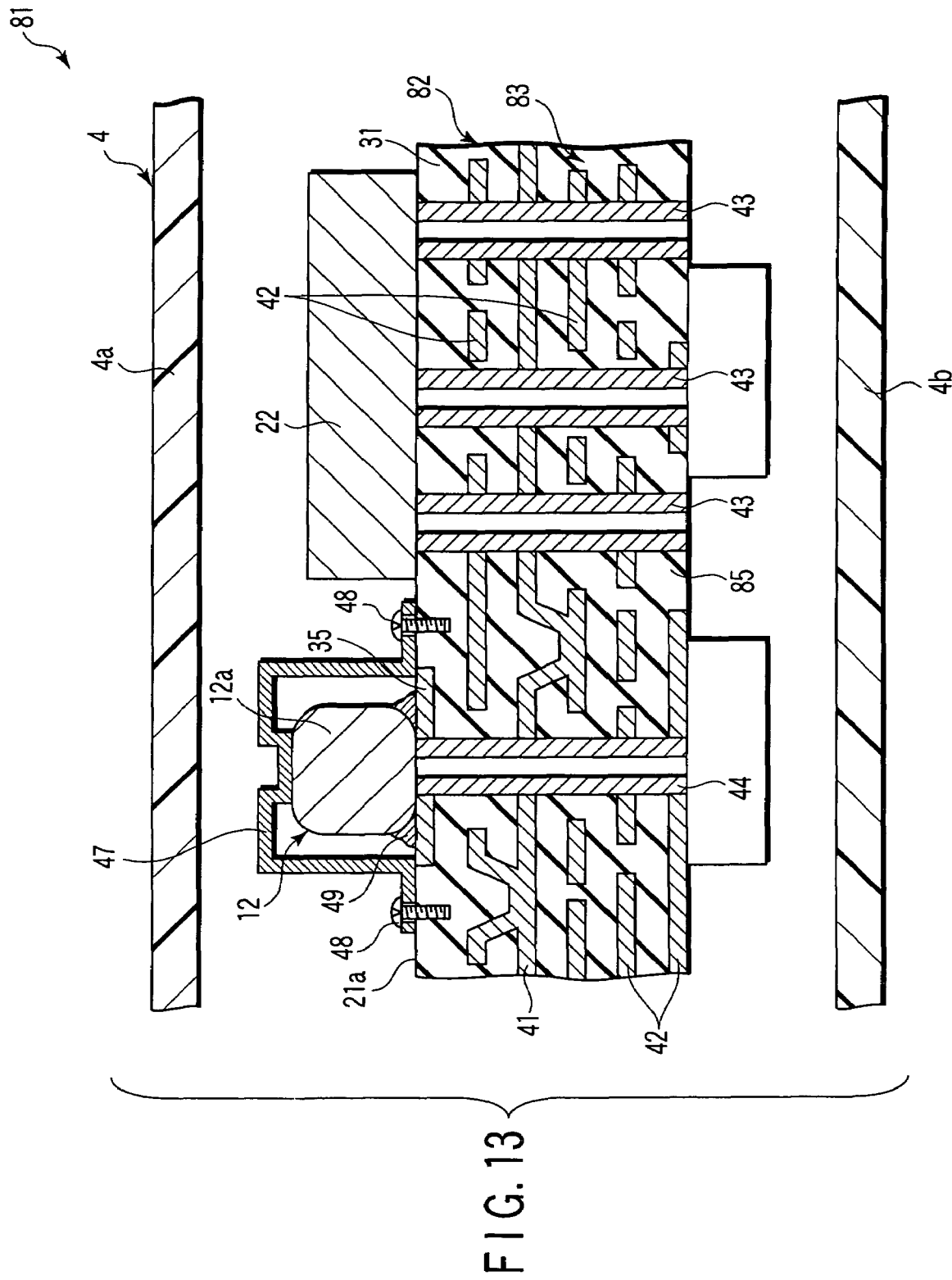
FIG. 13 is an exemplary sectional view of the portable computer taken along a line F13-F13 depicted in FIG. 12.

A portable computer 81 as an electronic apparatus according to another embodiment will now be described with reference to FIGS. 12 and 13. It is to be noted that the same reference numerals denote structures having corresponding or similar functions as those of the portable computer 1 according to the first embodiment, thereby omitting their explanation. This embodiment is intended to reduce thicknesses of a circuit board unit and an electronic apparatus.

As shown in FIG. 12, a circuit board unit 82 of the portable computer 81 has a circuit board section 83, a heat pipe 12 and radiation fins 84. As depicted in FIG. 13, a printed circuit board 85 of the circuit board section 83 has a first conductor layer 35, a ground layer 41, third conductor layers 42, and first and second through holes 43 and 44.

A first end portion 12a of the heat pipe 12 is attached to the first conductor layer 35 of the printed circuit board 85. The first end portion 12a is attached to the same surface as a mount surface 21a on which a CPU 22 is mounted, and arranged to be aligned with the CPU 22 in a horizontal direction.

As shown in FIG. 12, a second end portion 12b of the heat pipe 12 is extended to a position which is outside the printed circuit board 85 and thermally connected to radiation fins 84.

It is to be noted that the radiation fins 84 are an example of a heat radiating member, and may be any other heat radiating member like a radiation plate, and type is no object.

A function of the portable computer 81 will now be described.

Like the portable computer 1 according to the first embodiment, heat generated by the CPU 22 is transferred to the second end portion 12b of the heat pipe 12. Heat which has been transferred to the second end portion 12b is further transferred to the radiation fins 84, and discharged to the outside of the circuit board unit 82 by heat transfer.

According to the portable computer 81 having such a configuration, a thickness of the radiation structure can be reduced. That is, as shown in FIG. 13, when the heat pipe 12 is attached to the same surface as the mount surface 21a on which the CPU 22 is mounted, a thickness of the circuit board unit 82 can be reduced to a value which is a larger one of a value obtained by adding a thickness of the printed circuit board 85 and that of the heat pipe 12 and a value obtained by adding the thickness of the printed circuit board 85 and that of the CPU 22. This contributes to a reduction in thickness of the circuit board unit 82 and the portable computer 81.

Although the heat pipe 12 is not directly attached to the CPU 22, it is positioned in the vicinity of the CPU 22. Therefore, the first end portion 12a of the heat pipe 12 can sufficiently absorb heat generated by the CPU 22. Additionally, in this embodiment, the heat pipe 12 is thermally connected to the CPU 22 through the first conductor layer 35, the ground layer 41, the third conductor layers 42 and the first and second through holes 43 and 44. Therefore, the first end portion 12a of the heat pipe 12 can further effectively absorb heat generated by the CPU 22.

Although the above has described the portable computers 1, 51, 61, 71 and 81 according to the first to fourth embodiments and another embodiment, embodiments of the present invention is not restricted thereto, and the structures of the respective embodiments may be appropriately combined. For example, it is possible to provide one or more printed circuit board which function as heat radiating members in the circuit board section. The number of heat pipes 12 attached to the circuit board section is not restricted to one, and a plurality of heat pipes 12 may be provided. The electronic apparatus to which embodiments of the present invention can be applied is not restricted to a portable computer, and it may be, e.g., a mobile phone, a digital camera, a video camera, a personal digital assistant or the like, and its type is no object.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a housing;
   a circuit board section accommodated in the housing, the circuit board section comprising (i) a heat generating component, (ii) a circuit board on which the heat generating component is mounted and which comprises a heat receiving region thermally connected to the heat generating component, and a heat radiating region having a lower temperature than the heat receiving region while the apparatus is operating, and (iii) a circuit component which is mounted on the heat radiating region of the circuit board and generates a smaller calorific value than the heat generating component; and a heat transfer member provided on the circuit board, and comprising a first end portion attached in the heat receiving region and a second end portion attached in the heat radiating region, the first end portion being attached to a surface on which the heat generating component is mounted, wherein the circuit board comprises a board main body; a conductor layer which is provided in each of the heat receiving region and the heat radiating region and is exposed outside the circuit board to contact the heat transfer member, another conductor layer which is provided in the board main body, and a via hole through which this conductor layer is thermally connected to the conductor layer which is exposed to the outside.

2. An electronic apparatus comprising:

a housing;

a circuit board section accommodated in the housing, the circuit board section comprising (i) a heat generating component, (ii) a first circuit board on which the heat generating component is mounted and which comprises a heat receiving region thermally connected to the heat generating component, (iii) a second circuit board which comprises the heat radiating region having a lower temperature than the heat receiving region while the apparatus is operating, and (iv) a circuit component which is mounted on the heat radiating region and generates a smaller calorific value than the heat generating component; and a heat transfer member provided to extend from the first circuit board to the second circuit board and comprising a first end portion attached in the heat receiving region and a second end portion attached in the heat radiating region, the first end portion being attached to a surface on which the heat generating component is mounted, wherein the circuit board section comprises a board main body, a conductor layer which is provided in each of the heat receiving region and the heat radiating region and is exposed outside the circuit board section to contact the heat transfer member, another conductor layer which is provided in the board main body, and a via hole through which this conductor layer is thermally connected to the conductor layer which is exposed to the outside.

3. An electronic apparatus comprising:

a housing;

a circuit board section accommodated in the housing, the circuit board section comprising a heat generating component, a heat receiving region thermally connected to the heat generating component, and a heat radiating region having a lower temperature than the heat receiving region while the apparatus is operating; and a heat transfer member comprising a first end portion attached in the heat receiving region and a second end portion attached in the heat radiating region, wherein the circuit board section comprises (i) a board main body; (ii) a conductor layer which is provided in each of the heat receiving region and the heat radiating region, said conductor layer being exposed outside the circuit board section, covered with the first or second end portion of the heat transfer member and thermally connected to the heat transfer member, (iii) another conductor layer which is provided in the board main body, and (iv) a via hole through which this conductor layer is thermally connected to the conductor layer which is exposed to the outside.

4. The electronic apparatus according to claim 3, wherein said another conductor layer is a ground layer.

5. An electronic apparatus comprising:

a housing;

a circuit board contained in the housing;

a heat generating component mounted on the circuit board; and, a heat transfer member contained in the housing;

wherein the circuit board comprises a heat receiving region and a heat radiating region, the heat receiving region being a part of the circuit board which is thermally connected to the heat generating component, the heat radiating region being another part of the circuit board which has a lower temperature than the heat receiving region while the apparatus is operating, the heat transfer member comprises a first end portion thermally connected to the heat receiving region of the circuit board, and a second end portion thermally connected to the heat radiating region of the circuit board; and wherein the circuit board comprises a board main body, a conductor layer which is provided in each of the heat receiving region and the heat radiating region and is exposed outside the circuit board to contact the heat transfer member, another conductor layer which is provided in the board main body, and a via hole through which this conductor layer is thermally connected to the conductor layer which is exposed to the outside.

6. The electronic apparatus of claim 5, wherein the heat transfer member is provided inward of the circuit board.

7. The electronic apparatus of claim 5, wherein the heat transfer member is configured to transfer some of the heat generated by the heat generating component, from the heat receiving region to the heat radiating region of the circuit board to diffuse the transferred heat within the circuit board.

8. The electronic apparatus of claim 5, further comprising a circuit component which generates a smaller calorific value than the heat generating component, wherein the circuit component is mounted in the heat radiating region of the circuit board.

9. The electronic apparatus of claim 5, wherein the circuit board comprises a surface on which the heat generating component is mounted, the first end portion of the heat transfer member is attached to the surface of the circuit board.

10. An electronic apparatus comprising:

a housing;

a first circuit board contained in the housing;

a second circuit board contained in the housing;

a heat generating component mounted on the first circuit board; and, a heat transfer member extending from the first circuit board to the second circuit board;

wherein the first circuit board comprises a heat receiving region, the heat receiving region being a part of the first circuit board which is thermally connected to the heat generating component, the second circuit board comprise a heat radiating region, the heat radiating region being a part of the circuit board which has a lower temperature than the heat receiving region while the apparatus is operating, the heat transfer member comprises a first end portion thermally connected to the heat receiving region of the first circuit board, and a second end portion thermally connected to the heat radiating region of the second circuit board; and wherein the first and second circuit boards each comprise a board main body, a conductor layer which is exposed outside the board main body to contact the heat transfer member, another conductor layer which is provided in the board main body, and a via hole through which this conductor layer is thermally connected to the conductor layer which is exposed to the outside.

11. The electronic apparatus of claim 10, wherein the heat transfer member is configured to transfer some of the heat generated by the heat generating component, from the heat receiving region of the first circuit board to the heat radiating region of the second circuit board.

12. The electronic apparatus of claim 10, further comprising
a circuit component which generates a smaller calorific value than the heat generating component,
wherein the circuit component is mounted in the heat radiating region of the second circuit board.

13. The electronic apparatus of claim 10, wherein the first circuit board comprises a surface on which the heat generating component is mounted,
the first end portion of the heat transfer member is attached to the surface of the first circuit board.

* * * * *